US008390742B2

(12) United States Patent
Abe et al.

(10) Patent No.: US 8,390,742 B2
(45) Date of Patent: Mar. 5, 2013

(54) SEMICONDUCTOR INTEGRATED CIRCUIT AND VIDEO SIGNAL OUTPUT CIRCUIT (75) Inventors: Shuhei Abe, Tama (JP); Nagayoshi Dobashi, Tama (JP); Yoshiaki Hirano, Osaka (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 490 days.

(21) Appl. No.: 12/686,425

(22) Filed: Jan. 13, 2010

(65) Prior Publication Data

US 2010/0182512 A1    Jul. 22, 2010

(30) Foreign Application Priority Data

Jan. 19, 2009   (JP) .................................. 2009-008912

(51) Int. Cl.
*H04N 5/14*   (2006.01)
(52) U.S. Cl. ........ 348/707; 348/678; 348/680; 348/697; 348/689; 348/704; 330/259; 330/270; 330/278; 330/290; 330/291
(58) Field of Classification Search .................. 348/678, 348/680, 697, 689, 704, 707, 528
See application file for complete search history.

(56) References Cited

U.S. PATENT DOCUMENTS

| | | | |
|---|---|---|---|
| 4,105,945 A | | 8/1978 | Sano et al. |
| 4,544,951 A | * | 10/1985 | Yoshisato ...................... 348/691 |
| 5,194,827 A | * | 3/1993 | Kowalik et al. ............... 330/304 |
| 5,374,966 A | * | 12/1994 | Weigand ........................ 348/707 |
| 5,508,749 A | * | 4/1996 | Matsuo .......................... 348/500 |
| 5,532,601 A | * | 7/1996 | Weir et al. ..................... 324/539 |
| 5,787,182 A | * | 7/1998 | Hoshino et al. ................. 381/74 |
| 5,953,043 A | * | 9/1999 | Shaw ............................. 725/152 |
| 6,154,256 A | * | 11/2000 | Bruins .......................... 348/533 |
| 7,184,099 B1 | * | 2/2007 | Hojabri ......................... 348/696 |
| 2005/0105364 A1 | * | 5/2005 | Hashimoto .................... 365/222 |
| 2006/0280436 A1 | | 12/2006 | Koo et al. |

FOREIGN PATENT DOCUMENTS

| | | |
|---|---|---|
| JP | 01 221005 | 9/1989 |
| JP | 8 167815 A | 6/1996 |
| JP | 2004-274434 | 9/2004 |
| JP | 2004274434 A * | 9/2004 |
| JP | 2005 184056 | 7/2005 |

OTHER PUBLICATIONS

Sano et. al, Video Signal Correction Circuit, Sep. 30, 2004, Nippon Precision Circuits Inc. (NPL translation corresponding to IDS document JP 2004-274434).*
European Office Action dated Jan. 27, 2012.
Partial European Search Report mailed Apr. 7, 2010.
Extended European Search Report.

* cited by examiner

*Primary Examiner* — Jefferey Harold
*Assistant Examiner* — Humam Satti
(74) *Attorney, Agent, or Firm* — IPUSA, PLLC (57) ABSTRACT

In a semiconductor integrated circuit arranged to perform sag compensation for a video signal, an operational amplifier includes a non-inverted input terminal, an inverted input terminal, and an output terminal, in which a video signal is input to the non-inverted input terminal. A first resistor includes a first end connected to the inverted input terminal and a second end being grounded. The output terminal is connected to a first external terminal and the inverted input terminal is connected to a second external terminal. A second resistor includes a first end connected to the output terminal and a second end connected to the inverted input terminal. A first capacitor is disposed between the first external terminal and the second external terminal and connected in parallel to the second resistor, and the second resistor has a resistance value determined based on a capacitance value of the first capacitor.

3 Claims, 7 Drawing Sheets

$$\text{SAG RATIO} = \frac{A'}{A} \times 100$$

FIG.11 RELATED ART

SEMICONDUCTOR INTEGRATED CIRCUIT AND VIDEO SIGNAL OUTPUT CIRCUIT

BACKGROUND OF THE INVENTION

1. Field of the Invention

This invention relates to a semiconductor integrated circuit and a video signal output circuit which are arranged to amplify and output a video signal.

2. Description of the Related Art

Conventionally, a video signal output circuit which amplifies and outputs a video signal, such as an NTSC (National Television Standards Committee) signal, is known. The video signal is made up of composite signals including a vertical synchronizing signal with a low frequency (for example, 60 Hz), a luminance signal with a frequency up to several MHz, etc. Video signal output circuits according to the related art have been improved to allow transmission of the video signal including these component signals without distortion of the waveform of the video signal.

Figure 10:
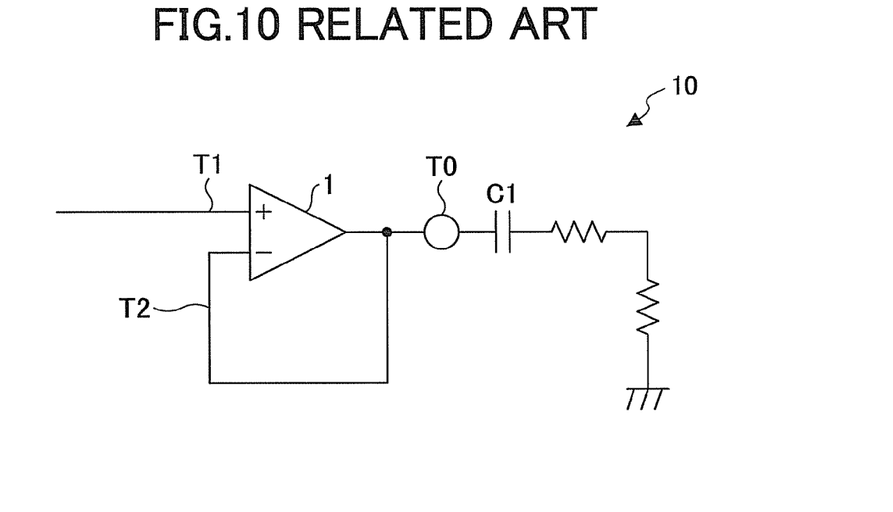
FIG. 10 is a diagram illustrating the composition of a video signal output circuit according to the related art.

FIG. 10 illustrates the composition of a video signal output circuit according to the related art. In the video signal output circuit 10 of FIG. 10, an operational amplifier 1 includes a non-inverted input terminal T1 and an inverted input terminal T2. A video signal is input to the non-inverted input terminal T1 of the operational amplifier 1, and the inverted input terminal T2 of the operation amplifier 1 is connected to an output terminal To of the operational amplifier 1. The video signal amplified by the operational amplifier 1 is output from the output terminal To. Moreover, a capacitor C1 which is provided for removing the direct-current component contained in the video signal output is connected to the output terminal To.

In the video signal output circuit 10 of FIG. 10, a capacitor with a large capacitance is used as the capacitor C1 in order to eliminate distortion of the waveform of the video signal output. However, if the capacitance of the capacitor C1 is increased, the capacitor C1 is increased in volume (size) and the mounting area of the capacitor C1 is increased. This is not appropriate for the video signal output circuit from a viewpoint of miniaturization of products.

Figure 11:
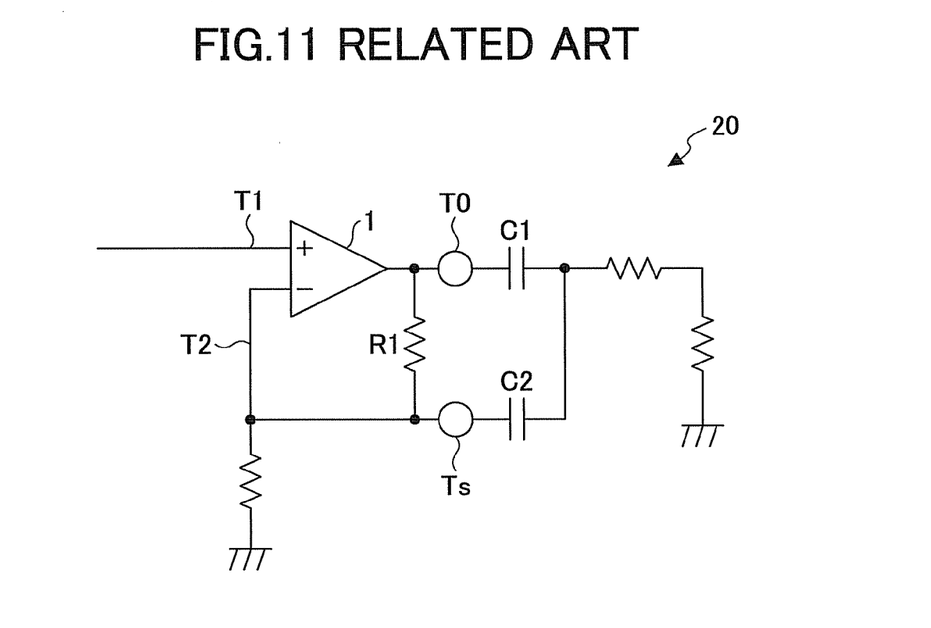
FIG. 11 is a diagram illustrating the composition of another video signal output circuit according to the related art.

FIG. 11 illustrates the composition of another video signal output circuit according to the related art. In the video signal output circuit 20 of FIG. 11, a circuit which is provided for compensating distortion (sag) of the waveform of a video signal is arranged so that the capacitance of the capacitor C1 is decreased.

In the video signal output circuit 20 of FIG. 11, the operational amplifier 1 is provided with a sag compensation terminal Ts in addition to the output terminal To. The sag compensation terminal Ts is connected to both the inverted input terminal T2 of the operational amplifier 1 and one end of a resistor R1. The other end of the resistor R1 is connected to the output terminal To of the operational amplifier 1.

In the video signal output circuit 20 of FIG. 11, a capacitor C2 is arranged between one end of the capacitor C1 and the sag compensation terminal Ts of the operational amplifier 1, and this capacitor C2 is connected in parallel with the capacitor C1. The video signal that is output from the operational amplifier 1 and passed through the capacitor C1 is returned back to the sag compensation terminal Ts.

In the video signal output circuit 20 of FIG. 11, the capacitance of the capacitor C1 can be reduced by this composition, and distortion of the waveform of the video signal output can be compensated (sag compensation). For example, Japanese Laid-Open Patent Publication No. 2004-274434 discloses a video signal output circuit which performs sag compensation for a video signal.

However, the use of a lowered supply voltage in recent years makes it difficult for the video signal output circuit to perform sag compensation. For example, if the supply voltage to the operational amplifier 1 as illustrated in FIG. 11 is changed to a lowered supply voltage, the dynamic range of the operational amplifier 1 will be insufficient for the amplitude of the video signal, which will make it difficult to perform sag compensation for the video signal effectively. As a result, a lack of a synchronizing signal in the video signal will take place and detecting a synchronizing signal in the video signal will be impossible.

SUMMARY OF THE INVENTION

In one aspect of the invention, the present disclosure provides a semiconductor integrated circuit and a video signal output circuit which can prevent a lack of a synchronizing signal in a video signal output from the semiconductor integrated circuit or the video signal output circuit and can contribute to the miniaturization of products with low cost.

In an embodiment of the invention which solves or reduces one or more of the above-mentioned problems, the present disclosure provides a semiconductor integrated circuit arranged to perform sag compensation for a video signal output from the semiconductor integrated circuit, the semiconductor integrated circuit including: an operational amplifier including a non-inverted input terminal, an inverted input terminal, and an output terminal, in which a video signal is input to the non-inverted input terminal; a first resistor including a first end connected to the inverted input terminal of the operational amplifier and a second end being grounded; a first external terminal to which the output terminal of the operational amplifier is connected; a second external terminal to which the inverted input terminal of the operational amplifier is connected; and a second resistor including a first end connected to the output terminal of the operational amplifier and a second end connected to the inverted input terminal of the operational amplifier, wherein a first capacitor is disposed between the first external terminal and the second external terminal and connected in parallel to the second resistor, and the second resistor has a resistance value that is determined based on a capacitance value of the first capacitor.

In an embodiment of the invention which solves or reduces one or more of the above-mentioned problems, the present disclosure provides a video signal output circuit arranged to perform sag compensation for a video signal output from the video signal output circuit, the video signal output circuit including: an operational amplifier including a non-inverted input terminal, an inverted input terminal, and an output terminal, in which a video signal is input to the non-inverted input terminal; a first resistor including a first end connected to the inverted input terminal of the operational amplifier and a second end being grounded; a second resistor including a first end connected to the output terminal of the operational amplifier and a second end connected to the inverted input terminal of the operational amplifier; a first capacitor disposed between the output terminal and the inverted input terminal of the operational amplifier and connected in parallel to the second resistor; and a filter circuit including a second capacitor, a third resistor, and a fourth resistor which are connected in series, an end of the fourth resistor being grounded and an end of the second capacitor being connected to the output terminal of the operational amplifier, wherein the second resistor has a resistance value that is determined based on a capacitance value of the first capacitor.

Other objects, features and advantages of the invention will be apparent from the following detailed description when read in conjunction with the accompanying drawings.

DETAILED DESCRIPTION OF PREFERRED EMBODIMENTS

A description will now be given of embodiments of the invention with reference to the accompanying drawings.

Figure 1:
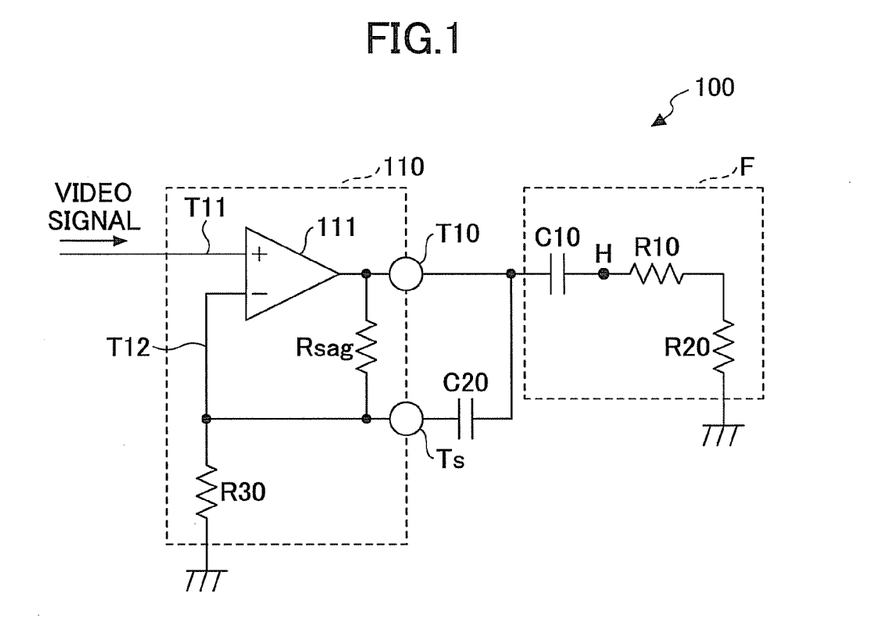
FIG. 1 is a diagram illustrating the composition of a video signal output circuit of an embodiment of the invention.

FIG. 1 illustrates the composition of a video signal output circuit 100 of an embodiment of the invention.

As illustrated in FIG. 1, the video signal output circuit 100 of this embodiment includes a semiconductor integrated circuit 110, a capacitor C10, a capacitor C20, a resistor R10, and a resistor R20.

The semiconductor integrated circuit 110 of this embodiment has an operational amplifier 111, and this operational amplifier 111 amplifies a video signal which is input to the semiconductor integrated circuit 110. The semiconductor integrated circuit 110 includes an external terminal T10, an external terminal Ts, the operational amplifier 111, a resistor R30, and a resistor Rsag.

In the semiconductor integrated circuit 110, the video signal is input to a non-inverted input terminal T11 of the operational amplifier 111. An inverted input terminal T12 of the operational amplifier 111 is grounded through the resistor R30. The inverted input terminal T12 of the operational amplifier 111 is connected through the resistor Rsag to the external terminal T10 which is an output terminal of the operational amplifier 111.

The resistor Rsag is a resistor which is provided for performing sag compensation for the video signal. One end of the resistor Rsag is connected to the external terminal T10, and the other end of the resistor Rsag is connected to the external terminal Ts.

In the video signal output circuit 100 of this embodiment, the capacitor C10 is a capacitor which is provided for removing the direct-current component contained in the video signal. The resistor R10 and the resistor R20 are provided to constitute an impedance-matching resistor (75Ω). The capacitor C10, the resistor R10, and the resistor R20 are connected in series to constitute a high-pass filter F. One end of the capacitor C10 is connected to the external terminal T10 of the semiconductor integrated circuit 110. One end of the resistor R20 is grounded. The signal output from a junction point H of the capacitor C10 and the resistor R10 is an output signal of the video signal output circuit 100.

The capacitor C20 is a capacitor which is provided for performing sag compensation for a video signal output from the operational amplifier 111. One end of the capacitor C20 is connected to the external terminal Ts of the semiconductor integrated circuit 110, and the other end of the capacitor C20 is connected to the external terminal T10 of the semiconductor integrated circuit 110.

Therefore, in the video signal output circuit 100 of this embodiment, the resistor Rsag and the capacitor C20 are connected in parallel between the inverted input terminal T12 and the output terminal of the operational amplifier 111. Namely, in this embodiment, the video signal before being passed through the capacitor C10 is returned back to the non-inverted input terminal T12 of the operational amplifier 111.

If a resistance of the resistor Rsag, a capacitance of the capacitor C10 and a capacitance of the capacitor C20 in this embodiment are set to optimal values, the video signal output circuit 100 which has the above-described composition can decrease the capacitance values of the capacitor C10 and the capacitor C20 from those of the video signal output circuit according to the related art, and can prevent a lack of a synchronizing signal in the video signal output.

In this embodiment, the optimal values of the resistance of the resistor Rsag, the capacitance of the capacitor C10 and the capacitance of the capacitor C20 are determined as follows. The resistance of the resistor Rsag, the capacitance of the capacitor C10 and the capacitance of the capacitor C20 are set to the optimal values which change a sag ratio (which will be described later) of the video signal to be smaller than or equal to a predetermined value so that distortion of the waveform of the video signal output from the video signal output circuit 100 does not influence the quality of the resulting image. Specifically, in this embodiment, the resistance of the resistor Rsag, the capacitance of the capacitor C10, and the capacitance of the capacitor C20 are set to the optimal values which change the sag ratio of the video signal to be smaller than or equal to 0.5% so that distortion of the waveform of the video signal does not influence the quality of the resulting image.

Figure 2:
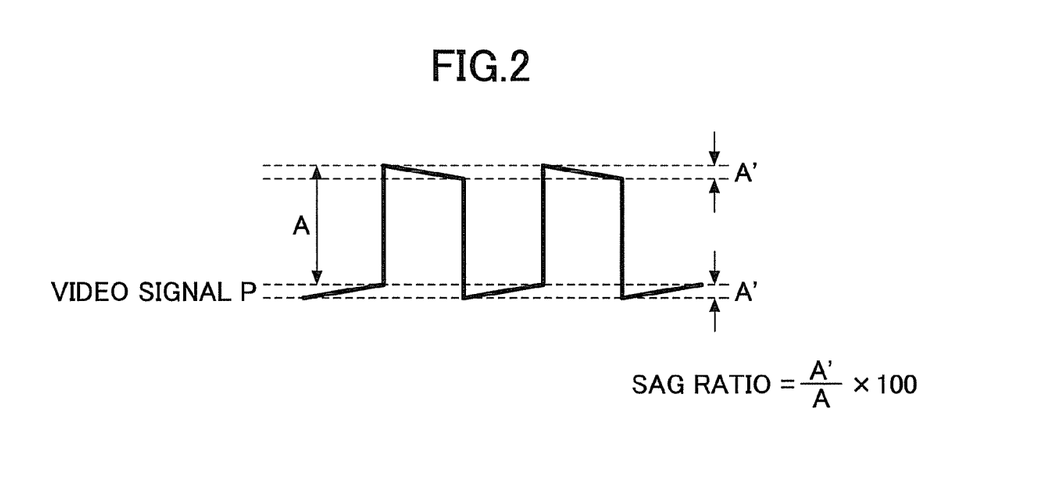
FIG. 2 is a diagram for explaining a sag ratio of a video signal.

Next, a description will be given of a sag ratio of a video signal with reference to FIG. 2. FIG. 2 is a diagram for explaining a sag ratio of a video signal.

The video signal P illustrated in FIG. 2 is an output signal of the video signal output circuit 100. As illustrated in FIG. 2, the sag ratio of the video signal P is represented by $A'/A \times 100(\%)$ where A denotes an amplitude of the video signal P and $A'$ denotes a distortion of the waveform of the video signal P. Specifically, in this embodiment, the sag ratio is changed to be smaller than or equal to 0.5% by setting the resistance of the resistor Rsag, the capacitance of the capacitor C10 and the capacitance of the capacitor C20 to the optimal values.

Figure 3:
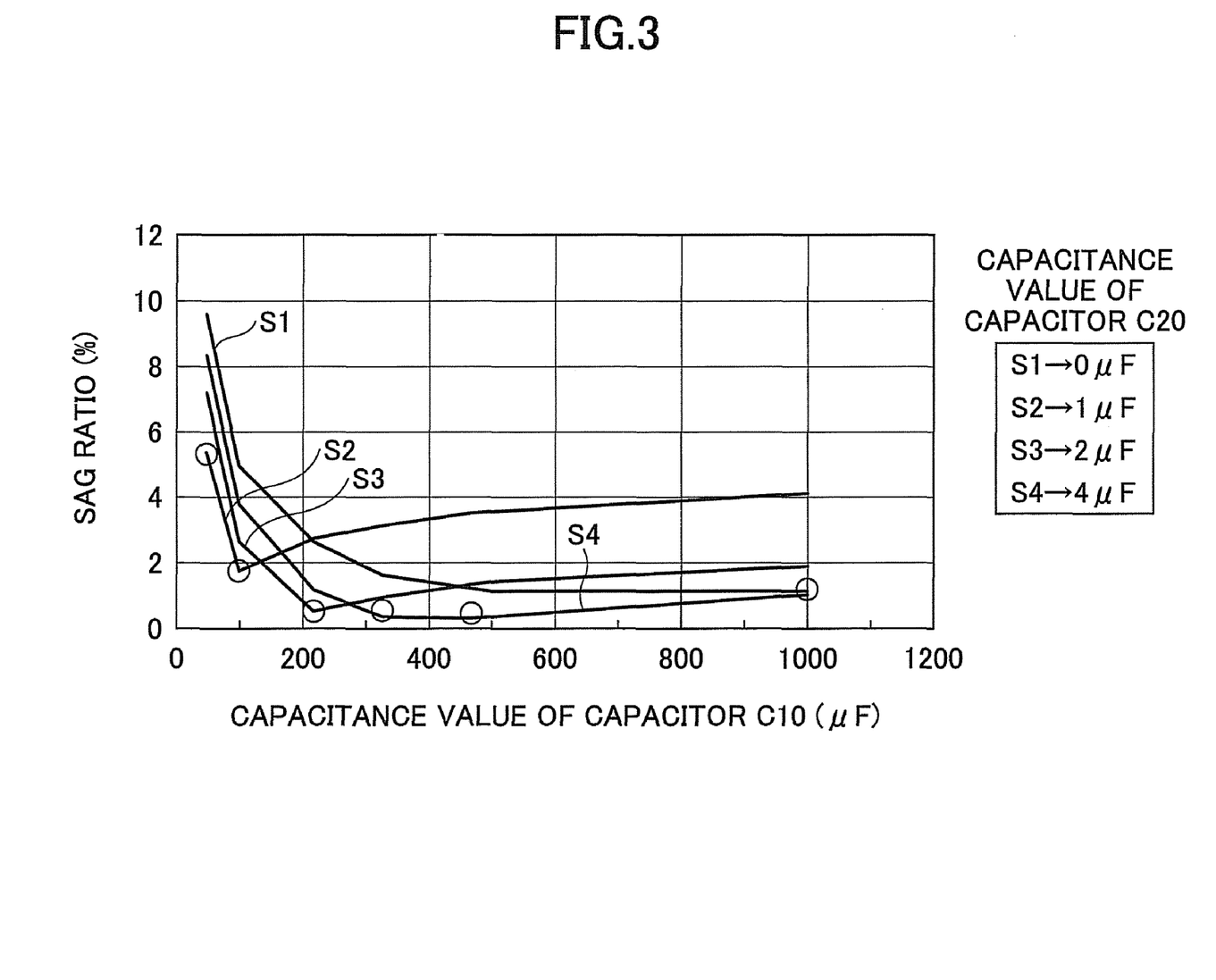
FIG. 3 is a diagram for explaining setting of capacitance values of a capacitor C10 and a capacitor C20.
Figure 4:
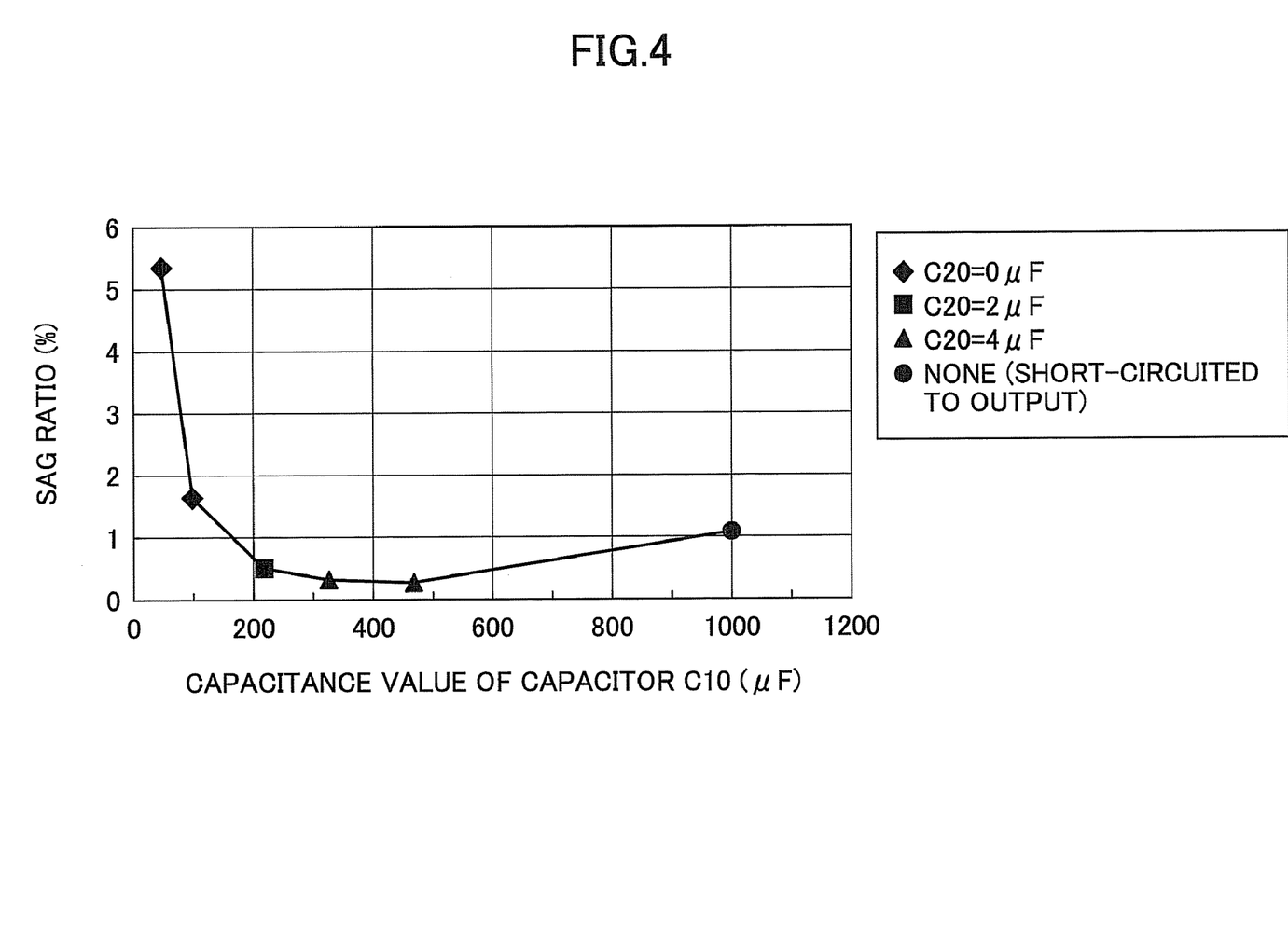
FIG. 4 is a diagram for explaining setting of the capacitance values of the capacitor C10 and the capacitor C20.

Next, setting of the capacitance values of the capacitor C10 and the capacitor C20 will be described with reference to FIG. 3 and FIG. 4. FIG. 3 is a diagram for explaining setting of the capacitance values of the capacitor C10 and the capacitor C20. FIG. 4 is a diagram for explaining setting of the capacitance values of the capacitor C10 and the capacitor C20.

In FIG. 3, the relationship between the capacitance value of the capacitor C10 and the sag ratio when the capacitance value of the capacitor C20 is changed are illustrated. Specifically, in FIG. 3, the relationship between the capacitance value of the capacitor C10 and the sag ratio when the value of the capacitor C20 is set to 0 μF is indicated by the curve S1, the relationship between the capacitance value of the capacitor C10 and the sag ratio when the value of the capacitor C20 is set to 1 μF is indicated by the curve S2, the relationship between the capacitance value of the capacitor C10 and the sag ratio when the value of the capacitor C20 is set 2 μF is indicated by the curve S3, and the relationship between the capacitance value of the capacitor C10 and the sag ratio when the value of the capacitor C20 is set to 4 μF is indicated by the curve S4.

In this embodiment, as illustrated in FIG. 3, when the capacitance of the capacitor C10 is equal to a specific value, the capacitance value of the capacitor C20 with which the sag ratio is the smallest is selected, and the capacitance value of the capacitor C10 and the capacitance value of the capacitor C20 are optimized based on the selected value.

Specifically, when the capacitance of the capacitor C10 is equal to 47 μF, the capacitance value of the capacitor C20 with which the sag ratio is the smallest is 1 μF (on the curve S2 as illustrated in FIG. 3). Thus, 1 μF is selected as the capacitance value of the capacitor C20.

Next, when the capacitance of the capacitor C10 is equal to about 100 μF, the capacitance value of the capacitor C20 with which the sag ratio is the smallest is selected similarly. At this time, the capacitance value of the capacitor C20 with which the sag ratio is the smallest is 1 μF.

Next, when the capacitance of the capacitor C10 is about 200 μF, the capacitance value of the capacitor C20 with which the sag ratio is the smallest is selected similarly. At this time, the capacitance value of the capacitor C20 with which the sag ratio is the smallest is 2 μF (on the curve S3 as illustrated in FIG. 3). In this manner, the capacitance value of the capacitor C20 with which the sag ratio is the smallest when the capacitance of the capacitor C10 is equal to a specific value is selected.

FIG. 3 illustrates the measurement data of the sag ratio which is determined from the output signal of the semiconductor integrated circuit 110 when the capacitance value of the capacitor C10 and the capacitance value of the capacitor C20 are changed in the video signal output circuit 100 of this embodiment.

In FIG. 4, the curve which indicates the relationship between the pickup points of the capacitance value of the capacitor C10 in FIG. 3 and the measurement data of the sag ratio is illustrated. As illustrated in FIG. 4, the points where the sag ratio is smaller than or equal to 0.5% include the point at which the capacitance value of the capacitor C10 is about 220 μF and the capacitance value of the capacitor C20 is 2 μF, the point at which the capacitance value of the capacitor C10 is about 300 μF and the capacitance value of the capacitor C20 is 4 μF, and the point at which the capacitance value of the capacitor C10 is about 500 μF and the capacitance value of the capacitor C20 is 4 μF.

In this embodiment, the capacitor C10=220 μF and the capacitor C20=2 μF are selected as the optimal capacitance value of the capacitor C10 and the optimal capacitance value of the capacitor C20 which change the sag ratio to be smaller than or equal to 0.5%. This is because an electric field capacitor can be used as the capacitor C10 and a chip capacitor can be used as the capacitor C20, and at least one of the capacitor C10 and the capacitor C20 can be decreased in size.

For example, if the capacitor C10=300 μF and the capacitor C20=4 μF are selected as the optimal capacitance value of the capacitor C10 and the optimal capacitance value of the capacitor C20 which change the sag ratio to be smaller than or equal to 0.5%, both the capacitor C10 and the capacitor C20 must be an electric field capacitor. In this case, both the capacitor 10 and the capacitor C20 cannot be decreased in size, and it is difficult for the video signal output circuit of this embodiment to contribute to the miniaturization of products.

Next, setting of the resistance of the resistor Rsag in the video signal output circuit 100 of this embodiment will be described.

A cut-off frequency fc of the high-pass filter F constituted by the capacitor C10, the resistor R10 and the resistor R20 in the video signal output circuit 100 is determined as follows. The cut-off frequency fc is represented by the following Equation 1.

$$f_C = \frac{1}{2 \cdot \pi \cdot R_{load} \cdot C10} \quad \text{Equation 1}$$

In the above Equation 1, $R_{load}$ denotes a combined resistance of the resistor R10 and the resistor R20, and the combined resistance $R_{load}$ of this embodiment is represented by $R_{load}$=R10+R20.

Next, at the cut-off frequency fc, a voltage gain $A_v(fc)$ of the video signal output circuit 100 after sag compensation for the video signal is performed with the resistor Rsag and the capacitor C20 is determined. The voltage gain $A_v(fc)$ is determined by the following Equation 2.

$$A_V(fc) = \frac{1}{\beta} + \frac{\left(R_{sag} // \frac{1}{\omega_{fc} \cdot C20}\right)}{R30} \quad \text{Equation 2}$$

β in the above Equation 2 denotes a value which is computed by the following Equation 3.

$$\beta = \frac{R30}{R30 + 0} = 1 \quad \text{Equation 3}$$

In this embodiment, the resistance of the resistor Rsag can be determined in accordance with the foregoing Equations 1, 2, and 3. In this embodiment, the capacitor C10=220 μF and the capacitor C20=2 μF are selected as the optimal capacitance value of the capacitor C10 and the optimal capacitance value of the capacitor C20 which change the sag ratio to be smaller than or equal to 0.5%. By substituting these values of the capacitors C10 and C20 into the Equations 1 and 2, a resistance value of the resistor Rsag which changes the sag ratio to be smaller than or equal to 0.5% can be determined.

After the resistance value of the resistor Rsag is determined, it is determined whether a voltage gain $A_v(DC)$, which is determined by the following Equation 4 into which the resistance value of the resistor Rsag determined by the above Equations 1 to 3 is substituted, falls within the dynamic range of the operational amplifier 111.

$$A_V(DC) = \frac{1}{\beta} + \frac{R_{sag}}{R30} \quad \text{Equation 4}$$

If the voltage gain $A_v(DC)$ determined by the above Equation 4 does not fall within the dynamic range of the operational amplifier 111, the operational amplifier 111 does not output the video signal correctly. In this case, the capacitance value of capacitor C10 and the capacitance value of capacitor C20 must be adjusted to change the resistance value of the resistor Rsag to be smaller.

If the voltage gain $A_v(DC)$ falls within the dynamic range of the operational amplifier 111, the resistance of the resistor Rsag can be set to the value determined by the above Equation 4.

Next, a description will be given of an example in which the resistance of the resistor Rsag is determined in the case of the capacitor C10=220 μF, the capacitor C20=2 μF and the resistor $R_{load}$=150Ω.

The following Equation 5 is the same as the above Equation 1 into which the capacitance value of the capacitor C10 and the resistance value of the resistor $R_{load}$ are substituted.

$$f_c = \frac{1}{2 \cdot \pi \cdot 150 \cdot 220\mu} = 4.8 \text{ Hz} \quad \text{Equation 5}$$

By the above Equation 5, the cut-off frequency fc of the high pass filter F can be determined as fc=4.8 Hz. The following Equation 6 is the same as the above Equation 2 into which all of the above-mentioned values and the cut-off frequency fc (=4.8 Hz) determined by the above Equation 5 are substituted.

$$1.571 = 1.258 + \frac{\left(R_{sag} // \frac{1}{2 \cdot \pi \cdot 4.8 \cdot 2.2\mu}\right)}{12k} \quad \text{Equation 6}$$

By the above Equation 6, a resistance value of the resistor Rsag can be determined as Rsag=5 kΩ. If the voltage gain $A_v(DC)$ determined by the above Equation 4 into which this resistance value of the resistor Rsag is substituted falls within the dynamic range of the operational amplifier 111, the resistance of the resistor Rsag can be set to 5 kΩ. In this embodiment, the sag ratio can be changed to be smaller than or equal to 0.5% by using the computed resistance value of the resistor Rsag.

By setting the respective values of the resistor Rsag, the capacitor C10 and the capacitor C20 in the video signal output circuit 100 of this embodiment as described above, it is possible to perform sag compensation for the video signal sufficiently even when a lowered supply voltage is used as the supply voltage to the operational amplifier 111, and it is possible to prevent a lack of a synchronizing signal in the video signal output from the video signal output circuit 100.

Figure 5A:
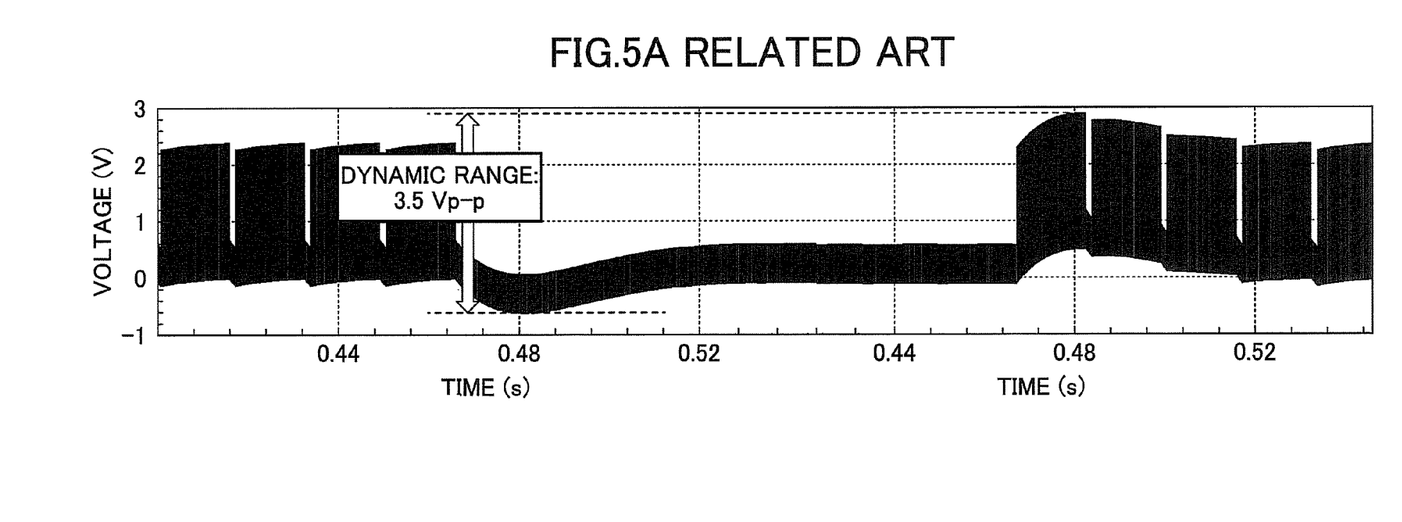
FIG. 5A and FIG. 5B are diagrams for explaining a video signal for which sag compensation is performed by the video signal output circuit of the present embodiment in comparison with a video signal for which sag compensation is performed by the video signal output circuit according to the related art.
Figure 5B:
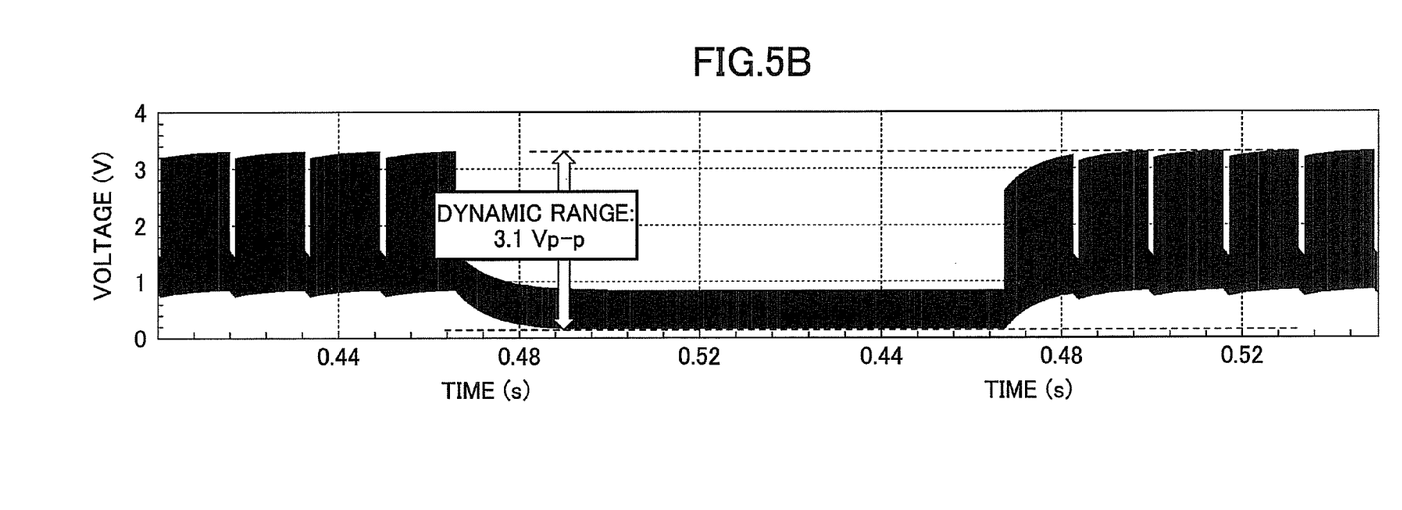

FIG. 5A and FIG. 5B are diagrams for explaining a video signal for which sag compensation is performed by the video signal output circuit 100 in comparison with a video signal for which sag compensation is performed by the video signal output circuit according to the related art. FIG. 5A illustrates the video signal for which sag compensation is performed by the video signal output circuit according to the related art.

FIG. 5B illustrates the video signal for which sag compensation is performed by the video signal output circuit 100 of this embodiment.

As illustrated in FIG. 5A, in order to prevent a lack of a synchronizing signal in a video signal at the time of transition from a white image to a black image, the operational amplifier in the video signal output circuit according to the related art requires the dynamic range of 3.5 Vp-p. However, as illustrated in FIG. 5B, the dynamic range needed for the operational amplifier 111 in the video signal output circuit 100 of this embodiment can be reduced to 3.1 Vp-p.

Therefore, in this embodiment, the operational amplifier 111 having a dynamic range narrower than the dynamic range of the operational amplifier in the video signal output circuit according to the related art can be used to perform sag compensation for the video signal without a lack of a synchronizing signal in the video signal.

Moreover, in this embodiment, the capacitance of the capacitor C10 and the capacitance of the capacitor C20 can be reduced from those in the video signal output circuit according to the related art. In this embodiment, a chip capacitor can be used as the capacitor C20 for sag compensation, and the mounting area of this capacitor can be reduced from that in the video signal output circuit according to the related art, which will enable cost reduction.

Therefore, the video signal output circuit 100 of this embodiment can prevent a lack of a synchronizing signal in the video signal and can contribute to the miniaturization of products with low cost.

In the foregoing embodiment, a video signal from an external device is input to the semiconductor integrated circuit 110. However, the semiconductor integrated circuit 110 is not limited to the specifically disclosed embodiment. For example, the semiconductor integrated circuit 110 as illustrated in FIG. 1 may be arranged to include a circuit which processes a video signal.

In the foregoing embodiment, after the capacitance values of the capacitors C10 and C20 are set, the resistance value of the resistor Rsag is determined based on the set capacitance values. Alternatively, the resistance value of the resistor Rsag may be determined before the capacitance values of the capacitors C10 and C20 are set. In this case, the capacitance values of the capacitors C10 and C20 are set in conformity with the resistance value of the resistor Rsag.

Next, a description will be given of several modifications of the present embodiment with reference to FIGS. 6 to 9.

Figure 6:
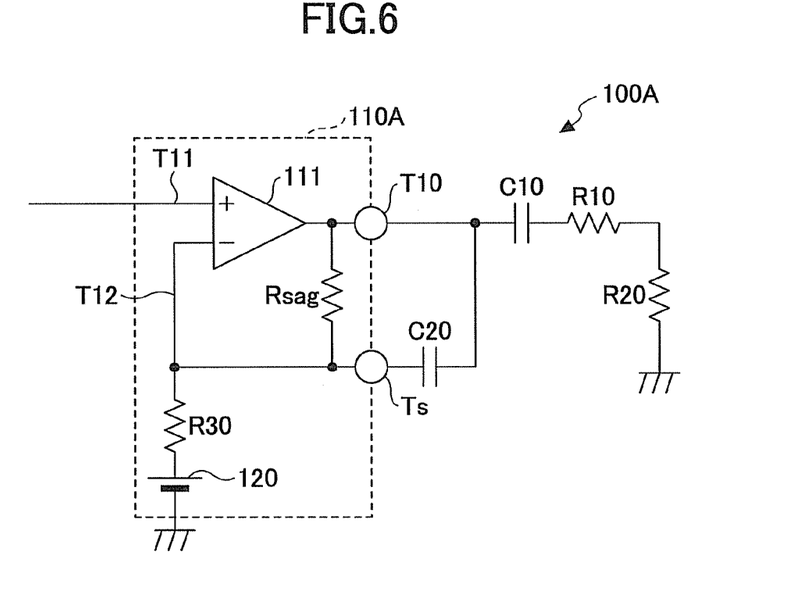
FIG. 6 is a diagram illustrating the composition of a first modification of the video signal output circuit of the present embodiment.

FIG. 6 illustrates the composition of a first modification of the video signal output circuit of the present embodiment.

In the video signal output circuit 100A of FIG. 6, a semiconductor integrated circuit 110A is arranged to include a voltage source 120 which is disposed between the resistor R30 and the ground to generate reference voltage Vref, and the operating point of the output signal of the video signal output circuit 100A is changed. In the video signal output circuit 100A of FIG. 6, the operating point of the output signal can be adjusted by changing the value of the generated reference voltage Vref.

Figure 7:
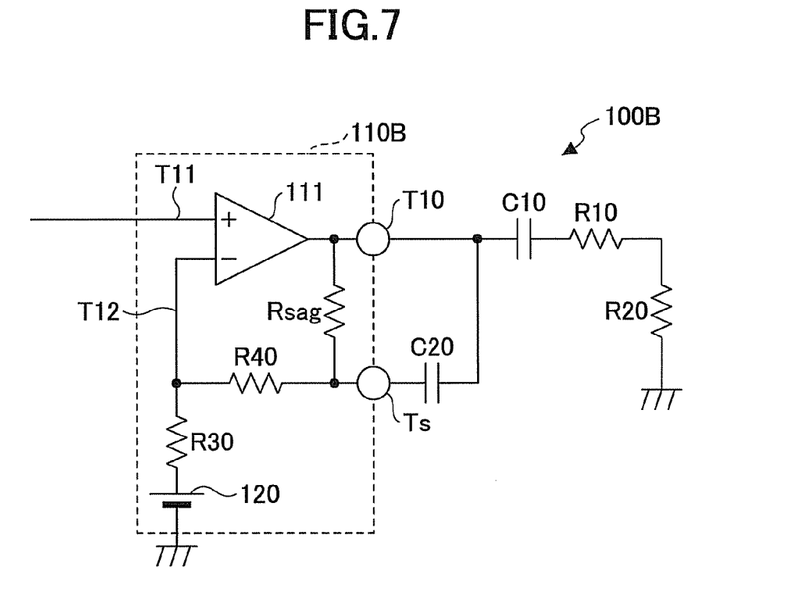
FIG. 7 is a diagram illustrating the composition of a second modification of the video signal output circuit of the present embodiment.

FIG. 7 illustrates the composition of a second modification of the video signal output circuit of the present embodiment.

In the video signal output circuit 100B of FIG. 7, a semiconductor integrated circuit 110B is arranged to include, in addition to the voltage source 120, a resistor R40 which is connected between the resistor Rsag and the resistor R30. In the video signal output circuit 100B, by arranging the resistor R40, it is possible to set the voltage gain to be in a high region.

In the video signal output circuit 100B of FIG. 7, β in the above Equation 3 can be determined by the following Equation 7.

$$\beta = \frac{R30}{R30 + R40} \qquad \text{Equation 7}$$

Figure 8:
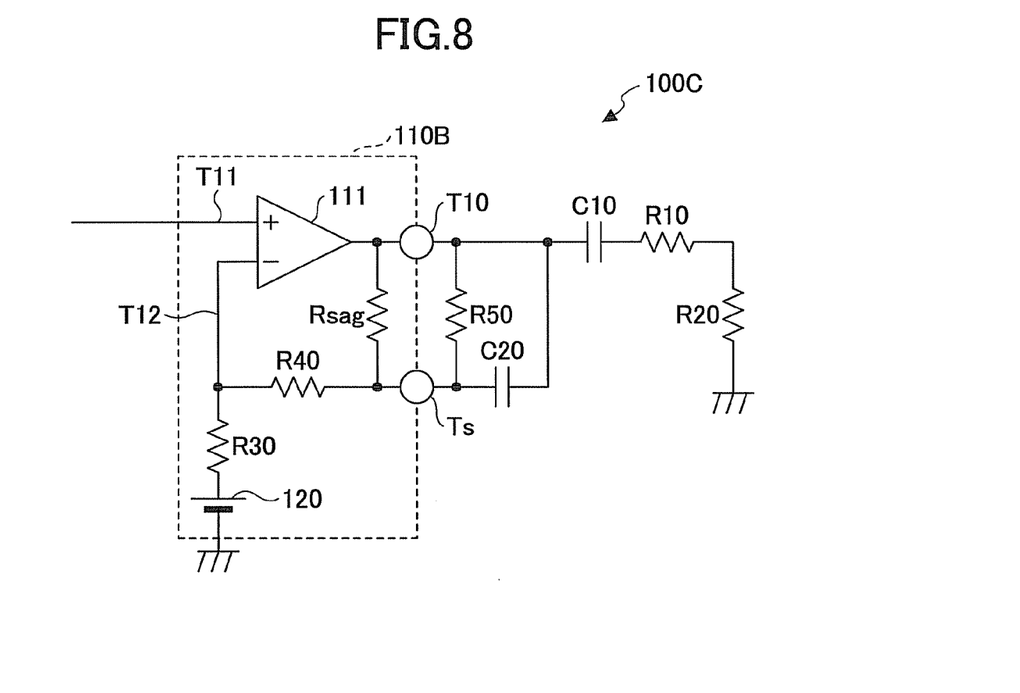
FIG. 8 is a diagram illustrating the composition of a third modification of the video signal output circuit of the present embodiment.

FIG. 8 illustrates the composition of a third modification of the video signal output circuit of the present embodiment.

The video signal output circuit 100C of FIG. 8 is arranged to include the semiconductor integrated circuit 110B, and a resistor R50 which is disposed outside the semiconductor integrated circuit 110B and connected between the output terminal T10 and the sag compensation terminal Ts. The resistor R50 between the output terminal T10 and the sag compensation terminal Ts is connected in parallel with the capacitor C20. In the video signal output circuit 100C of FIG. 8, the resistor R50 is arranged outside the semiconductor integrated circuit 110B, and the resistance of the resistor Rsag can be adjusted.

Figure 9:
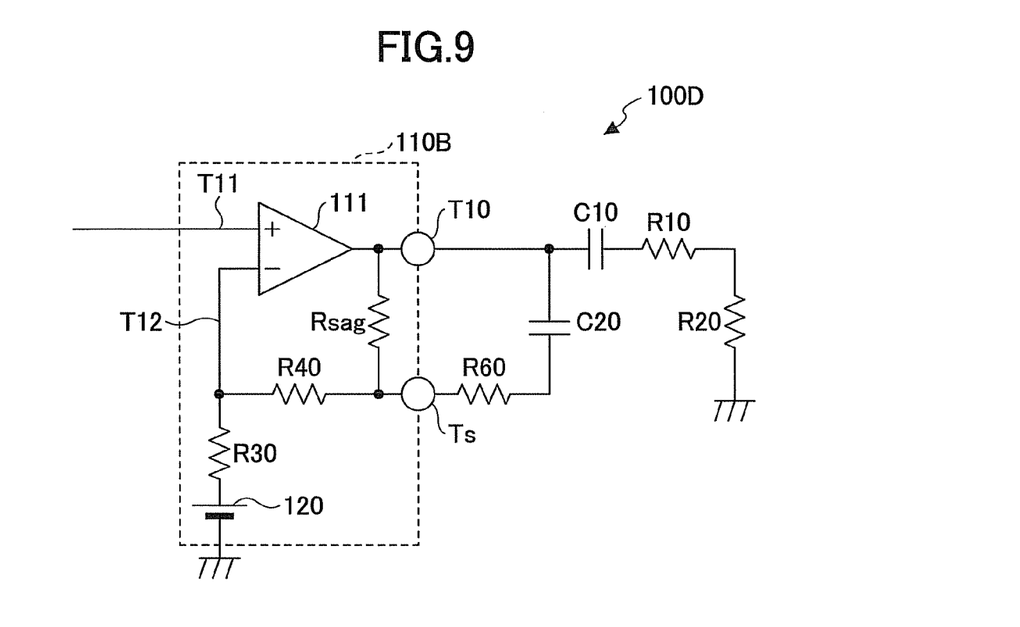
FIG. 9 is a diagram illustrating the composition of a fourth modification of the video signal output circuit of the present embodiment.

FIG. 9 illustrates the composition of a fourth modification of the video signal output circuit of the present embodiment.

The video signal output circuit 100D of FIG. 9 is arranged to include the semiconductor integrated circuit 110B, and a resistor R60 which is disposed outside the semiconductor integrated circuit 110B between the sag compensation terminal Ts and one end of the capacitor C20 and connected in series with the capacitor C20. In the video signal output circuit 100D of FIG. 9, the resistor R60 is arranged outside the semiconductor integrated circuit 110B and the resistance of the resistor Rsag can be adjusted.

According to the semiconductor integrated circuit and the video signal output circuit of the invention, a lack of a synchronizing signal in the video signal output from the semiconductor integrated circuit or the video signal output circuit can be prevented, and the semiconductor integrated circuit and the video signal output circuit of the invention can contribute to the miniaturization of products with low cost.

The present invention is not limited to the above-described embodiments, and variations and modifications may be made without departing from the scope of the invention.

The present application is based on Japanese patent application No. 2009-008912, filed on Jan. 19, 2009, the contents of which are incorporated herein by reference in their entirety.

What is claimed is:

1. A semiconductor integrated circuit arranged to perform sag compensation for a video signal output from the semiconductor integrated circuit, comprising:
    an operational amplifier including a non-inverted input terminal, an inverted input terminal, and an output terminal, in which a video signal is input to the non-inverted input terminal;
    a first resistor including a first end connected to the inverted input terminal of the operational amplifier and a second end being grounded;
    a first external terminal to which the output terminal of the operational amplifier is connected;
    a second external terminal to which the inverted input terminal of the operational amplifier is connected; and
    a second resistor including a first end connected to the output terminal of the operational amplifier and a second end connected to the inverted input terminal of the operational amplifier,
    wherein a first capacitor is disposed between the first external terminal and the second external terminal and connected in parallel to the second resistor, and the second resistor has a resistance value that is determined based on a capacitance value of the first capacitor,
    wherein a filter circuit is connected to a junction point between the first external terminal and the first capacitor, the filter circuit including a second capacitor, a third resistor, and a fourth resistor which are connected in series, and
    wherein the resistance value of the second resistor, a capacitance value of the second capacitor, and the capacitance value of the first capacitor are set such that a voltage gain falls within a dynamic range of the operational amplifier and a sag ratio of the video signal is smaller than or equal to 0.5%.

2. The semiconductor integrated circuit according to claim 1, wherein a voltage source which generates a reference voltage is connected between the first resistor and the ground.

3. The semiconductor integrated circuit according to claim 2, wherein a fifth resistor is connected in series between the first resistor and the second resistor.

* * * * *